United States Patent [19]

Uzunoglu

[11] 4,387,310
[45] Jun. 7, 1983

[54] TEMPERATURE STABILIZED SEMICONDUCTOR DELAY ELEMENT

[75] Inventor: Vasil Uzunoglu, Ellicott City, Md.

[73] Assignee: Communications Satellite Corporation, Washington, D.C.

[21] Appl. No.: 178,425

[22] Filed: Aug. 15, 1980

[51] Int. Cl.³ .................... H03K 5/159; H03K 3/26
[52] U.S. Cl. .................................. 307/591; 307/310; 307/303; 357/51
[58] Field of Search ............... 307/591, 253, 310, 303; 357/51, 35; 333/144, 152, 155

[56] References Cited

U.S. PATENT DOCUMENTS

| | | | |
|---|---|---|---|
| 2,827,259 | 3/1960 | Neal | 307/591 |
| 3,089,037 | 5/1963 | Ross | 307/591 |
| 3,656,034 | 4/1972 | Rideout | 357/35 |
| 3,848,141 | 11/1974 | Sterzer | 307/299 R |
| 4,072,866 | 2/1978 | Kabat | 307/591 |
| 4,100,565 | 7/1978 | Khajezgdeh et al. | 357/51 |

FOREIGN PATENT DOCUMENTS 279545  8/1963  Australia ........................ 307/293

Primary Examiner—Stanley D. Miller
Assistant Examiner—B. P. Davis
Attorney, Agent, or Firm—Sughrue, Mion, Zinn, Macpeak and Seas

[57] ABSTRACT

A temperature stabilized semiconductor delay element is comprised of an emitter and collector separated on a substrate by distance l. A voltage applied to ohmic contacts on either side of the emitter and collector provides an electric field E, whereby the delay $\tau$ between the emitter and collector is given by $\tau = l^2/\mu E$, where $\mu$ is the semiconductor mobility which varies with temperature. A compensation device located on the same substrate as the delay device provides the delay device with an electric field $E = K/\mu$, where K is constant, such that $\tau = l^2/K$. The time delay $\tau$ is thus independent of temperature.

15 Claims, 8 Drawing Figures

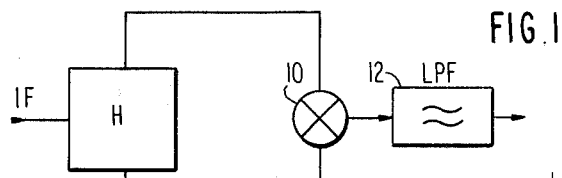
FIG.1
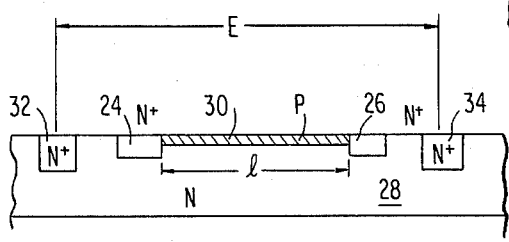
FIG.2
FIG.3
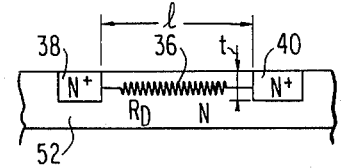
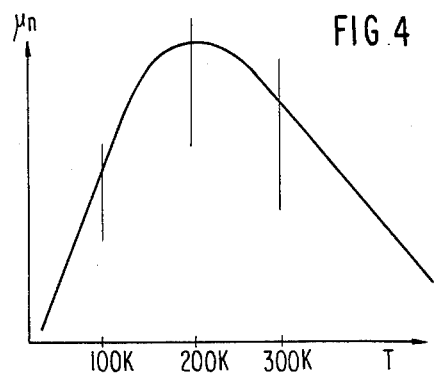
FIG.4
FIG.5a
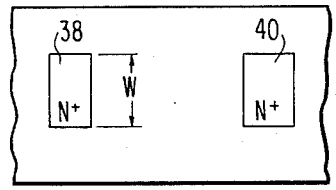
FIG.5b
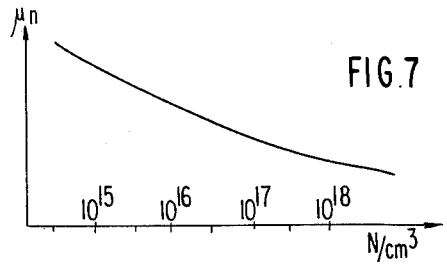
FIG.7
FIG.6
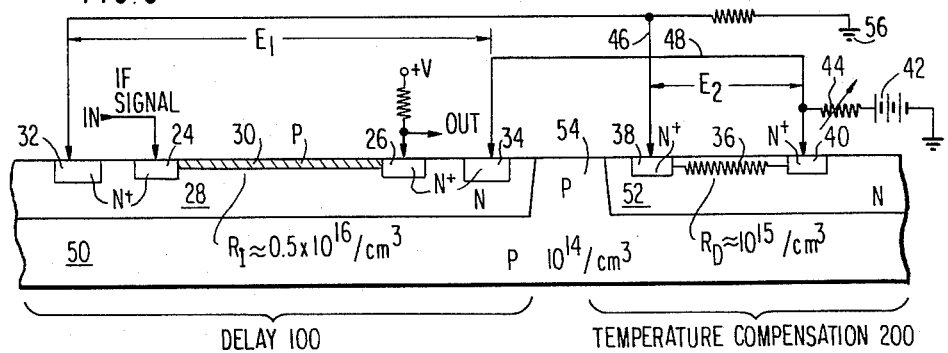

TEMPERATURE STABILIZED SEMICONDUCTOR DELAY ELEMENT

BACKGROUND OF THE INVENTION

The present invention is related to the field of delay elements and more specifically to a one-bit delay element for use in a differential demodulator.

In a differential demodulation apparatus, a mixer receives two IF signals, one directly and the other delayed by one bit in delay element $T_d$ as illustrated in FIG. 1. The IF signal is applied directly from hybrid H to the mixer 10, while the delayed signal is applied to the mixer 10 by way of the delay element $T_d$. The demodulated output from mixer 10 is applied to a low pass filter 12.

The one bit delay element $T_d$ in the demodulator must be insensitive to temperature variations. The performance of the differential demodulator degrades as the number of phases in the phase shift keyed (PSK) signal increase. Thus, temperature compensation for the delay line becomes even more important at high modulation levels. Coaxial cables can be used as the delay element $T_d$ and perform well as long as temperature variations are confined to a few degrees. As the temperature variations increase the delay time changes and the bit error rate increases. For example, cable RG-188 has a temperature coefficient of 250 ppm/C.°. This corresponds to an approximate phase shift of 4° at 70 MHz for a 40C.°variation. This phase shift produces a substantial degradation of the differential modulation at high modulation levels.

Further problems associated with the use of coaxial cable as a delay element are related to the size of the coaxial cable needed to provide the requisite time delay. For example, the delay in cable RG-188 amounts to approximately one nanosecond/food. For a 25 megabit data rate, 40 feet of cable are required. At a 10 megabit data rate, the amount of cable required is approximately 100 feet which is too bulky to be used.

SUMMARY OF THE INVENTION

The present invention avoids the above-mentioned problems associated with prior art delay elements by replacing the coaxial cable with a semiconductor delay line. The delay line is temperature compensated, and for the compensation uses a device fabricated on the same semiconductor chip as the delay element itself.

More specifically, the delay element is comprised of a p-type or n+-type emitter and collector diffused or alloyed in an n-type substrate, and separated by a predetermined distance l. The carriers produced by the emitter are under a dominant influence of an electric field applied across the emitter and collector. The electric field is provided by a second device fabricated on the same chip as the delay element and comprises a simple resistor between two n+ regions. The delay from the emitter to the collector in the delay element is a function of both electron mobility between the emitter and collector and the electric field applied across the emitter and collector. While the electron mobility decreases with an increase in temperature, the electric field produced by the simple resistor increases by a proportional amount in such a way as to cancel the effect of temperature upon the time delay.

BRIEF DESCRIPTION OF THE DRAWINGS

FIG. 1 is a block diagram of a differential demodulator which may employ the delay element in accordance with the present invention;

FIG. 2 is an illustration of the semiconductor delay device in accordance with a first embodiment of the present invention;

FIG. 3 is an illustration of the semiconductor delay device in accordance with a second preferred embodiment of the present invention;

FIG. 4 is a graph illustrating the effect of temperature on electron mobility;

FIGS. 5a and 5b illustrate the semiconductor resistor used to provide the temperature dependent electric field in accordance with the present invention;

FIG. 6 is an illustration of the entire semiconductor structure for providing a temperature independent delay in accordance with the present invention; and FIG. 7 is a graph of electron mobility as a function of carrier concentration.

DETAILED DESCRIPTION OF THE INVENTION

A first embodiment of the delay element in accordance with the present invention will be described with reference to FIG. 2. The delay element comprises a pair of p-type regions 14 and 16 diffused or alloyed on an n-type substrate 22. The emitter 14 and collector 16 are separated by a predetermined distance l. The configuration of the semiconductor illustrated in FIG. 2 is similar to a bipolar transistor with a wide base area. On either side of the emitter and collector are n+ ohmic contacts 18 and 20 across which an electric field is applied. Carriers are injected from the p-type emitter 14 to the n-type region 22, the flow of the carriers being enhanced or retarded by the polarity and strength of the electric field applied to the ohmic contacts. The p junctions for the emitter and collector must be shallow so that the carriers injected by the emitter into the n-type region flow to the p-type collector under the dominant control of the electric field.

A second and preferred embodiment of the delay element in accordance with the present invention will be described with reference to FIG. 3. In this embodiment, two n+ regions 24 and 26 are diffused or alloyed in the n-type substrate 28 to act as an emitter and collector respectively. A p-type region 30 having length l is formed between the two diffused or alloyed n+ regions by ion implantation. The electron carriers are emitted by the n+ region 24 into the p type region 30, the carrier flow being enhanced or retarded by the electric field produced across n+ ohmic contacts 32 and 34. As in the case of the FIG. 2 embodiment, the collector and emitter form shallow junctions, the n+ regions 32 and 34 having deeper penetration into the substrate, so that the electric field is more effective in controlling the carriers across the p region 30. The principle of operation of the FIG. 3 device is the same as in FIG. 2, namely the standard configuration of a transistor with a long base separation. The device illustrated in FIG. 3 has advantages over the structure of FIG. 2 however since ion implantation results in closer control of impurity levels in the p-type region, and the junctions may more easily be created with the required profiles.

The delay between the emitter 24 and collector 26 of FIG. 3 is given by the well-known relationship $$\tau = \frac{l^2}{\mu_{n1}E_1} \text{ where} \quad (1)$$

l = the distance in centimeters between the emitter and collector junctions,
$E_1$ = the electric field between the n+ contacts, and
$\mu_{n1}$ = the mobility of the minority carrier electrons in the p-type region 30.

The equation for the FIG. 2 embodiment is the same as equation (1) with $\mu_{n1}$ being replaced by $\mu_p$ to indicate the mobility of holes in the n-type region 22.

It can be seen from equation 1 that the mobility $\mu_{n1}$ and the electric field $E_1$ are equally effective in determining the delay. The mobility of the carriers is a function of temperature, as illustrated in FIG. 4. Around room temperature (300° K.), the mobility has a negative temperature coefficient, a temperature increase producing a decrease in mobility. This implies that when the temperature increases, the electric field $E_1$ must also be increased to keep the delay constant.

In order to achieve this effect, a second device illustrated in FIGS. 5a and 5b is fabricated on the same chip as the delay element to supply the electric field to the delay element. A simple resistive element 36 having length l, width w, and thickness t is formed between the two n+ ohmic contact regions 38 and 40 in n-type substrate 52. The majority carriers are responsible for the current flow.

The complete delay line in accordance with the preferred embodiment of the present invention is illustrated in FIG. 6. Like elements in FIGS. 3, 5 and 6 have identical reference numerals. The p-type substrate 50 is provided with n-type epitaxial layers 28 and 52. A p region 54 is diffused between the delay unit 100 and the temperature compensation unit 200 in order to provide mutual isolation. A voltage source 42 is applied to the ohmic contact 40 through variable resistor 44 which is adjusted to be close to the value of resistance 36 for impedance matching purposes. The current path from from region 40 to region 38 establishes an electric field $E_2$ across resistive region 36. An equal potential is applied from regions 38 and 40 to regions 32 and 34 via leads 46 and 49, respectively, to provide another electric field $E_1$. The IF input signal is applied to emitter 24, and the delayed IF output is taken from collector 26.

With reference to temperature compensation portion 200, since $$E_2 = IR = I\rho \cdot \frac{l}{wt}, \quad (2)$$

$$E_2 = \frac{Il}{q\mu_{n2}P_{n2}wt}, \quad (3)$$

Where
$\rho = 1/q\mu_{n2}P_{n2}$,
l = length of region between 38 and 40,
w = width of region between 38 and 40,
t = thickness of region between 38 and 40,
q = electron charge
$\mu_{n2}$ = electron mobility in region between 38 and 40, and
$P_{n2}$ = number of electrons in region between 38 and 40.

Since equation (3) can be written as $$E_2 = \frac{I}{\mu_{n2}q}\left(\frac{l}{w}\right)\left(\frac{1}{P_{n2}t}\right),$$

from *Semiconductor Network Analysis and Design*, by Vasil Uzunoglu, McGraw-Hill Book Co., 1964, p. 3, it is seen that $$E_2 = \frac{K_a}{\mu_{n2}}, \quad (4)$$

where $K_a$ = constant.

Since the mobility of both minority and majority carriers in regions 30 and 36, respectively can be considered approximately equal for regions of equal resistivity, as discussed by Phillips, in *Transistor Engineering*, McGraw-Hill Book Co., 1962, page 69, it follows that the resistivities of regions 30 and 52 be as close as possible so that the mobilities are approximately equal, $\mu_{n1} = \mu_{n2}$. Since the resistivities of the regions are linearly related to the carrier density of respective regions, the carrier density in the two regions must be as close as possible. The technique of ion implantation of region 30 into the n-type substrate 28 can provide these precise carrier densitites. See John E. Carroll, *Physical Models for Semiconductor Devices*, Crane, Russah & Company, Inc., New York.

As shown in FIG. 6, minor inequalities in carrier concentration may occur where $R_I \sim 0.5 \times 10^{16}/cm^3$ in region 30, and $R_D \sim 1.0 \times 10^{15}$ in region 52, for example. However, as shown in FIG. 7, even though the carrier concentration may vary by as much as a factor of 5, the corresponding change in mobility is relatively small. Therefore, in the linear region of the curve in FIG. 4, i.e. above approximately 250° K., $$\mu_{n1} \sim \mu_{n2}$$

Therefore, from equation (4)

$$E_2 = \frac{K_a}{\mu_{n1}}. \quad (6)$$

Since the same potential applied across region 36 is also applied across region 30,
$E_2 = K_b E_1$, and from equation (6), $$E_1 = \frac{K_a}{K_b} \cdot \frac{1}{\mu_{n1}} = \frac{K}{\mu_{n1}}$$

Therefore, from equation (1), $$\tau = \frac{l^2}{K}$$

Thus, the time delay $\tau$ is only dependent upon separation distance l and a constant K and is entirely independent of mobility and temperature.

An increase in temperature will decrease the mobility $\mu_n$, which in turn proportionally increases the electric field. (See equation 4.) The increase in the electric field will result in an enhancement of the carrier flow across the ion implanation region to keep the delay $\tau$ constant. Minor differences between the resistivity of $R_D$ and the resistivity of the ion implanted region $R_I$ are inevitable but will have little effect on the temperature compensation since only the mobilities of regions 30 and 52 need be equalized.

The fabrication of both the delay and temperature compensation devices on the same chip, along with ion implantation, make it possible to achieve a simple structure with virtually matched resistivities and equal mobilities of the diffused and epitaxial areas.

The device illustrated in FIG. 6 is obviously not restricted to differential demodulators, but can also be used as a temperature insensitive delay element in frequency modulators, injection oscillators, carrier recovery networks, and in many other areas. The temperature compensated delay device in accordance with the present invention is of relatively simple construction and with the advances in solid state technology can be produced in large quantities at very low cost. Since the compensation is achieved inherently on the same chip as the delay, the results are very reliable. Furthermore, the delay device in accordance with the present invention is much smaller than any other delay device available on the market. Still further, the delay device in accordance with the present invention may be used at any frequency within the limitations of semiconductor devices.

Various changes, additions, and ommissions of elements may be made within the the spirit and scope of this invention. It is to be understood that the invention is not limited to the specific details and examples described herein.

I claim:

1. A method of delaying an input signal by a delay time to provide a delayed output signal whereby said delay time is substantially independent of temperature comprising:
   applying a first electric field across a first semiconductor device having carriers of a first mobility;
   applying said input signal to an input of said first semiconductor device, said input signal propagating through said first semiconductor device to an output of said first semiconductor device after said delay time;
   applying a voltage across a second semiconductor device having carriers of a second mobility substantially equal to said first mobility to create a second electric field across said second semiconductor device whereby a decrease in said second carrier mobility will result in an increase in said second electric field and said voltage and whereby an increase in said carrier mobility will result in a decrease in said second electric field and said voltage;
   applying said voltage across said first semiconductor device to provide said first electric field; and
   varying said first electric field as a function of said first mobility.

2. An apparatus for delaying an input signal by a delay time to provide a delayed output signal whereby said delay time is substantially independent of temperature comprising:
   a first semiconductor device having an input, an output and carriers of a first mobility, said input signal being applied to said input and propagating through said first semiconductor to said output after said delay time; and
   means for (i) applying a first electric field across said first semiconductor device, and for (ii) varying said first electric field as a function of said first mobility; said means for applying and varying further comprising:
   a second semiconductor device having carriers of a second mobility substantially equal to said first mobility;
   means for applying a voltage and corresponding second electric field across said second semiconductor device; and
   means for applying said voltage across said first semiconductor device to thereby provide said first electric field.

3. The apparatus of claim 2 wherein said first semiconductor device comprises:
   a substrate;
   an emitter of carriers on said substrate;
   a collector of carriers on said substrate;
   a first ohmic contact on said substrate on a first side of said emitter and collector; and
   a second ohmic contact on said substrate on a second side of said emitter and collector.

4. The apparatus of claim 3 wherein said voltage is applied across said first semiconductor device at said first and second ohmic contacts.

5. The apparatus of claim 2 wherein said first semiconductor device comprises:
   a substrate;
   an emitter of carriers on said substrate;
   a collector of carriers on said substrate;
   a first ohmic contact on said substrate on a first side of said emitter and collector; and
   a second ohmic contact on said substrate on a second side of said emitter and collector.

6. The apparatus of claims 3 or 5 wherein said input is at said emitter and said output is at said collector.

7. The apparatus of claim 6 further comprising a base region in said substrate between said emitter and collector.

8. The apparatus of claim 11 wherein said base region is provided in said substrate by ion implantation, whereby the carrier density in said base region may be precisely determined.

9. The apparatus of claim 8 wherein said substrate is n-type semiconductor, said emitter and collector are n+-type semiconductor, and said base is p-type semiconductor.

10. The apparatus of claim 7 wherein said substrate and said base region are n-type semiconductor, and said emitter and collector are p-type semiconductor.

11. The apparatus of claim 9 wherein said first and second ohmic contacts are n+-type semiconductor.

12. The apparatus of claim 10 wherein said first and second ohmic contacts are n+-type semiconductor.

13. The apparatus of claim 3 wherein said second semiconductor device comprises:
   third and fourth ohmic contacts on said substrate, said first and second semiconductor devices being on said substrate and mutually isolated from each other.

14. The apparatus of claim 13 further comprising a base region in said substrate between said emitter and collector, and a resistive region in said substrate between said third and fourth ohmic contacts, said base region being provided by ion implantation, whereby the carrier concentration in said base region may be precisely controlled.

15. The apparatus of claim 13 wherein said means for applying and varying further comprises:
   a source of voltage connected to said second (34) and fourth (40) ohmic contacts; and
   a ground terminal (56) connected to said first (32) and third (38) ohmic contacts.

* * * * *